(12) United States Patent
Birkeland et al.

(10) Patent No.: US 8,779,275 B2
(45) Date of Patent: *Jul. 15, 2014

(54) THERMOELECTRIC GENERATOR BATTERY CHARGER AND POWER SUPPLY

(71) Applicant: Therm-Tech AS, Narvik (NO)

(72) Inventors: Bjørn Eirik Birkeland, Narvik (NO); Finn Erik Saghus, Narvik (NO); Erik Rosness, Asker (NO)

(73) Assignee: Therm-Tech AS, Narvik (NO)

( * ) Notice: Subject to any disclaimer, the term of this patent is extended or adjusted under 35 U.S.C. 154(b) by 16 days.

This patent is subject to a terminal disclaimer.

(21) Appl. No.: 13/776,442

(22) Filed: Feb. 25, 2013

(65) Prior Publication Data

US 2013/0167892 A1 Jul. 4, 2013

Related U.S. Application Data

(63) Continuation of application No. 12/602,032, filed as application No. PCT/EP2009/059725 on Jul. 28, 2009, now Pat. No. 8,404,962.

(30) Foreign Application Priority Data

Aug. 1, 2008 (NO) .................................... 20083371

(51) Int. Cl.
  *H02J 7/00* (2006.01)
  *H01L 35/00* (2006.01)
  *H01L 35/30* (2006.01)

(52) U.S. Cl.
  CPC . *H01L 35/30* (2013.01); *H02J 7/00* (2013.01); *H01L 35/00* (2013.01)
  USPC .............................. 136/207; 136/205; 320/101

(58) Field of Classification Search
  USPC ............ 320/101, DIG. 19, DIG. 21; 136/205, 136/206, 207, 217, 218, 230–232, 200, 211, 136/212, 242
  See application file for complete search history.

(56) References Cited

U.S. PATENT DOCUMENTS 528,924 A     11/1894   Cox
3,082,276 A *  3/1963   Corry et al. .................... 136/205
(Continued)

FOREIGN PATENT DOCUMENTS

EP     0 945 680 A1    9/1999
JP     2006-032848     2/2006
KR     2003-0004648    1/2003

OTHER PUBLICATIONS

International Search Report for PCT/EP2009/059725 dated Oct. 27, 2009.

(Continued)

*Primary Examiner* — Richard V Muralidar
(74) *Attorney, Agent, or Firm* — Knobbe Martens Olson & Bear LLP

(57) ABSTRACT

A portable device for supplying with power of at least one portable electrical load or gadget (70), wherein the device (10) is adapted to be manually heated and comprises at least one thermoelectric element (20) having one hot or warm side (21) and one cold side (22), a container (30) attached to the cold side (22) and adapted for holding or keeping a cooling medium or fluid (90) therein, a power converter (60) and a set of cables (65) coming out of the thermoelectric element (20) and connected to the electrical load (70) via the power converter (60).

15 Claims, 1 Drawing Sheet

(56) References Cited

U.S. PATENT DOCUMENTS

| | | | |
|---|---|---|---|
| 6,166,317 A | 12/2000 | Volk, Jr. et al. | |
| 6,410,842 B1 | 6/2002 | McAlonan | |
| 8,089,242 B2 * | 1/2012 | Loudot | 320/101 |
| 8,101,846 B1 * | 1/2012 | Schroeder et al. | 136/200 |
| 8,404,962 B2 * | 3/2013 | Birkeland et al. | 136/207 |
| 2006/0118157 A1 | 6/2006 | Johnson et al. | |
| 2007/0096564 A1 | 5/2007 | Maeda | |
| 2008/0111517 A1 * | 5/2008 | Pfeifer et al. | 320/101 |
| 2011/0139407 A1 * | 6/2011 | Ohler et al. | 165/104.28 |

OTHER PUBLICATIONS

Norwegian Search Report for 2008 3371 dated Jan. 29, 2009.

* cited by examiner

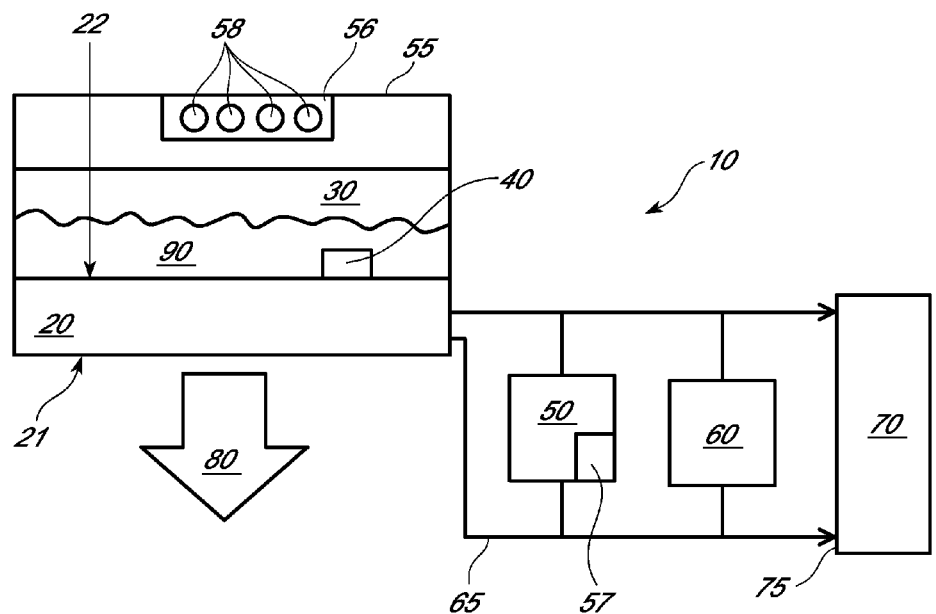

THERMOELECTRIC GENERATOR BATTERY CHARGER AND POWER SUPPLY

RELATED APPLICATIONS

Any and all priority claims identified in the Application Data Sheet, or any correction thereto, are hereby incorporated by reference under 37 CFR 1.57.

FIELD OF THE INVENTION

The present invention relates to a portable charger and power supply using an alternative energy source and capable of charging at least one battery and/or supplying with power at least one portable load or gadget, where the common power is not supplied or present, e.g. for outdoor use in the wilderness. Said at least one battery that is being charged by the charger is to be used in a portable load or gadget such as for example a mobile or satellite phone, video or digital camera, CD, DVD or MP3 player, iPod, GPS device, laptop or other portable consumer or load.

BACKGROUND OF THE INVENTION

Lots of people enjoy getting out in the wilderness. However, most of them are still attached to their everyday gadgets such as mobile phones, cameras, MP3 players, etc. Most of these devices are driven by rechargeable batteries. Thus, there is a need for a portable charger and power supply capable of charging at least one battery and/or supplying with power at least one portable gadget, without using a conventional electrical power source.

Portable chargers converting light energy obtained from the sun into electrical energy which is to be supplied to a battery for charging it, are known in the art, cf. Korean (KR) patent publication No. 20010003661 and Japanese (JP) patent publication No. 9182315. However, these chargers depend on the local conditions. For example, if the weather is cloudy or in polar areas during winter, the chargers most probably will not work.

Hence, an improved portable battery charger and power supply using alternative energy and adapted for outdoor or wilderness use would be advantageous, and in particular a more efficient and/or reliable portable battery charger and power supply using alternative energy and adapted for outdoor or wilderness use would be advantageous.

OBJECT OF THE INVENTION

It is an object of the present invention to provide a portable device using alternative energy that is capable of being converted into electrical energy and being controlled by a user, wherein the generated energy is used to charge at least one battery for use in a portable gadget/portable electrical load, and/or to supply with power the same and/or another portable gadget or electrical load.

Another object of the present invention is to provide a portable device using the thermoelectric effect, also called as Seebeck or Peltier effect, in order to charge at least one battery and/or to supply with power a small portable gadget or electrical load.

Yet another object of the present invention is to provide a portable device for charging at least one battery and/or supplying with power a small portable gadget or electrical load, wherein the portable device comprises means for protecting the thermoelectric element(s) and electronic circuits therein. The small portable gadget or electrical load can also be protected by said protection means.

Preferably said portable device according to the invention is adapted for outdoor or wilderness use, where the common power is not supplied or present.

It is a further object of the present invention to provide an alternative to the prior art.

It may also be seen as an object of the present invention to provide a portable battery charger and power supply adapted for outdoor or wilderness use that solves the above mentioned problems of the prior art.

SUMMARY OF THE INVENTION

Thus, the above described objects and several other objects are intended to be obtained in a first aspect of the invention by providing a portable battery charger and power supply according to the claims.

One aspect of the present invention is to provide a portable device for charging at least one rechargeable battery and/or for supplying with power at least one portable gadget or load, wherein the portable device comprises at least one thermoelectric element with one cold side and one hot or warm side, an electronic power converter and a container on the cold side for holding or keeping a cooling medium or fluid therein. The portable device can further comprise means for protecting said at least one thermoelectric element and electronic circuits from being permanently damaged. The protective device or means is completely self-sufficient. Neither the user nor the electric load (battery or portable gadget) needs to be aware of or be involved with this device.

Another aspect of the invention is to provide a portable device using an alternative energy source and adapted for outdoor or wilderness use, where the common power is not supplied or present.

When the portable device is not used as a charger and/or power supply, its container can be used to hold valuables or other articles of value or interest, and/or the container can be used as a lunch box (for keeping food therein) or plate (for eating food therefrom). Additionally, the container can be watertight. The container can also have other areas of application of benefit for the user being out in the wilderness.

When in use the portable device can have its container filled with e.g. cold water, snow or ice in order to add or provide cold on the cold side of said at least one thermoelectric element. Heat can be added on the hot side of said at least one thermoelectric element, i.e. on the underside of the portable device, by way of manually tended open flames, such as charcoal fire, campfire, camping heater, cooker, wood-burning stove (e.g. in a cabin, cottage or vessel), etc. The portable device uses the thermoelectric effect (Seebeck or Peltier effect). The device will also work with the water boiling in the container, wherein the boiling water represents the cooling medium or fluid on the cold side and can be used for example for making tea or coffee. Electricity is generated by said at least one thermoelectric element (also called Seebeck or Peltier element) provided between the cold side and the hot side. The generated electricity is then monitored and converted by said power converter, e.g. but not limited to only: input from about 0.1 V to about 30 V, particularly about 0.4-10 V, and output about 1.2-1.5 V/0.5-4 A or about 5 V/0.5-1.0 A. Then the available output power is used to charge said at least one battery and/or to supply with power said portable gadget or load. The rechargeable battery can be of type AA or AAA or other commercially available types suitable for mobile or satellite phones, video or digital cameras, CD, DVD or MP3 players, GPS devices, laptops, portable radio, etc. For example a mobile phone and particularly its battery will very fast be charged sufficiently enough to be able to make an emergency call if necessary. Full charging of the mobile phone battery will for example occur in about 1 hour. It will also be possible to charge 1, 2, 3 or 4 rechargeable batteries of type AA or AAA. The device can comprise at least one cable coming out of the converter and having at one end thereof at least one male plug or female receptacle which is to be plugged in the respective female receptacle or male plug of the portable gadget or load, for supplying it with power or for charging its battery or battery pack.

Another aspect of the present invention is to provide a portable device for charging at least one rechargeable battery and/or supplying with power at least one portable gadget or load, wherein the portable device comprises means for protecting the thermoelectric element(s) and electronic circuits.

The thermoelectric or Seebeck generators or elements can be used with manually tended open flames. In such applications these devices using the thermoelectric effect are susceptible to damage from overheating due to diverted attention of the user. The remedy is to be careful, wasting time and fuel on a generator not operating under optimum conditions, or have some protection device or means.

The protection means monitors the temperature on the cold side of the portable device and the actual power delivered from the device. The temperature on the cold side is measured by a suitable sensor. Measuring the temperature on the hot side proves difficult because of the harsh environment of flames there, including smoke and deposits, and because no reference point can be defined on the hot side as the heat there cannot be expected to distribute evenly from an open flame. The cold side, on the other hand, must provide a heat transportation system which normally leads the heat in a well defined flow incorporating good reference points.

As the temperature rises, the thermoelectric element produces more power. If, for any reason such as when the batteries are fully charged, the power is not consumed by the load, the output voltage of the element starts building up. To protect the load from overvoltage, a circuit for dumping excess power can be used to keep the output or generated voltage within a safe limit.

At some point when heating up, the combination of the cold side temperature and the power being produced indicates that the hot side temperature may damage the element. In such case, the excess power dumping circuit is activated, draining the power out of the element. This increases the heat flow through the element, effectively draining away dangerous heat from the hot side. It is also possible to have an audible and/or visible indicator showing or reminding the user that the flame (of e.g. a gas cooker or heater) or the heat (of e.g. coal- or wood-burning stove) should be regulated.

The individual aspects of the present invention may each be combined with any of the other aspects. These and other aspects of the invention will be apparent from the following description with reference to the described embodiments and the enclosed drawings.

BRIEF DESCRIPTION OF THE DRAWINGS

The portable device for charging of a battery and/or for supplying of a portable gadget or load according to the present invention will now be described in more detail with regard to the accompanying drawings. The drawings show one way of implementing the invention and are not to be construed as being limiting to other possible embodiments falling within the scope of the attached claim set.

FIG. 1 shows a portable device according to the invention.

DETAILED DESCRIPTION OF THE EMBODIMENTS

FIG. 1 shows a schematic view of a portable device 10 according to the present invention. The device 10 can be manually heated in order to use the thermo-electric effect to supply with power at least one small or portable electrical load 70. The device 10 comprises at least one thermoelectric element 20 having one hot or warm side 21 and one cold side 22, a container 30 attached to the cold side 22 and adapted for keeping a cooling medium or fluid 90 therein, an electronic power converter 60 and a set of cables 65 coming out of said at least one thermoelectric element 20 and connected to said at least one electrical load 70 via the electronic power converter 60. The electronic power converter 60 can for example be, but is not limited to, a DC-to-DC convertor. The device 10 can further comprise means 40, 50 for protecting said at least one thermoelectric element 20, said electronic power converter 60 and possibly the electrical load 70 from being permanently damaged. When the temperature on the hot side 21 of said at least one thermoelectric element 20 exceeds 250-300° C. the chances of the thermoelectric element 20 getting damaged increase. The heat on the hot side 21 is provided by manually tended open flame(s) 80, such as charcoal fire, campfire, camping heater, cooker, wood-burning stove, etc. The protection means 40, 50 can comprise a sensor 40 for measuring the temperature on the cold side 22 and/or a circuit 50 for dumping excess power, which circuit 50 is arranged right after the thermoelectric element 20 and before the electronic power converter 60 and the electrical load 70, i.e. the excess power dumping circuit 50 is arranged between the thermoelectric element 20 and the power converter 60. Thus the power converter 60 and the electrical load 70 are also protected from being damaged. The temperature on the hot side 21 can be calculated on the basis of the measured temperature on the cold side 22 and the actual voltage and current delivered from the device 10. The actual voltage and current delivered from the device 10 can for example be detected by the excess power dumping circuit 50. Additionally, the device 10, i.e. the protection means 40, 50, can comprise an audible and/or visible indicator (not shown) in order to show or remind the user that the flame(s) 80 (of e.g. a gas cooker or heater) or the heat (of e.g. coal- or wood-burning stove) should be regulated. The use of the indicator is not limited only to preventing damages; it may also indicate optimum heat for best charge rate, fuel economy, charging status, etc.

Said at least one electrical load 70 can be at least one battery or battery pack 70 that is to be charged by the device 10, or a portable gadget or load 70 that is to be supplied with power by the device 10. Said portable gadget or load 70 can for example be a mobile or satellite phone, video or digital camera, CD, DVD or MP3 player, iPod, GPS device, portable radio, laptop or the like. Said battery or battery pack can be of type AA or AAA or other commercially available types suitable for the above-mentioned gadgets.

The portable device 10 can comprise a cover (not shown) for the container 30 having room for accommodation of up to four AA or AAA batteries that are to be charged by the device 10. The compartment within the container 30 can with the help of the cover be made watertight.

At least one cable coming out of the power converter 60 can at one end thereof comprise at least one male plug or female receptacle 75 which is to be plugged in the respective female receptacle or male plug of the portable gadget or load 70, for thus supplying it with power and/or for charging its battery or battery pack.

The device 10 can be about 4 or more cm high and about 11 cm in diameter. However, the device 10 should not be limited to these dimensions only, and other suitable dimensions should thus be possible.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

What is claimed is:

1. A portable device for supplying power to at least one electrical load, the device comprising:
    at least one thermoelectric element having a cold side and a hot side;
    an electronic power converter operably coupled to the cold side; and
    a container coupled to the cold side and configured to accommodate a cooling medium;
    wherein the device is configured to be manually heated and wherein the device comprises an audible or visible indicator showing the user that the heat should be regulated, wherein the audible or visible indicator is configured to indicate a charge rate of the device.

2. The portable device of claim 1, the device further comprising at least one cable electrically coupling the thermoelectric element to the electronic power converter.

3. The portable device of claim 1, the device further comprising at least one cable electrically coupling the electronic power converter to the at least one electrical load.

4. The portable device of claim 3, wherein the at least one cable includes a female plug.

5. The portable device of claim 3, wherein the at least one cable includes a male plug.

6. The portable device of claim 1, wherein the container is configured to hold liquid.

7. The portable device of claim 1, wherein the container is watertight.

8. The portable device of claim 1, wherein the device can include a cover for the container.

9. The portable device of claim 8, wherein the cover engages with the container in a watertight manner.

10. The portable device of claim 1, wherein the device is configured to accommodate one or more batteries.

11. A method of using the portable device of claim 10 to supply power to at least one electrical load, the method comprising:
    electrically coupling the electronic power converter to the at least one electrical load;
    manually heating the hot side of the at least one thermoelectric element; and
    introducing the cooling medium to the container.

12. The method of claim 11, the method further comprising regulating the heat on the hot side of the at least one thermoelectric element in response to an audible or visual signal from the audible or visible indicator.

13. The portable device of claim 1, wherein the at least one electrical load comprises one or more batteries.

14. A method of using the portable device of claim 1 to supply power to at least one electrical load, the method comprising:
    electrically coupling the electronic power converter to the at least one electrical load;
    manually heating the hot side of the at least one thermoelectric element; and
    introducing the cooling medium to the container.

15. The method of claim 14, the method further comprising regulating the heat on the hot side of the at least one thermoelectric element in response to an audible or visual signal from the audible or visible indicator.

* * * * *